United States Patent
Pohl et al.

[11] Patent Number: 6,104,615
[45] Date of Patent: Aug. 15, 2000

[54] SEMICONDUCTOR COMPONENT ASSEMBLY

[75] Inventors: Jens Pohl, Bernhardswald; Simon Muff; Michael Schneider, both of Regensburg, all of Germany

[73] Assignee: Siemens Aktiengesellschaft, Munich, Germany

[21] Appl. No.: 09/154,484

[22] Filed: Sep. 16, 1998

[30] Foreign Application Priority Data

Sep. 16, 1997 [DE] Germany ............... 197 40 701

[51] Int. Cl.[7] ........................................ H05K 7/20
[52] U.S. Cl. ..................... 361/719; 257/713; 361/715
[58] Field of Search .................... 165/80.3, 185; 174/16.3; 257/706, 707, 713, 722–724; 361/703–704, 707, 715, 709–712, 717–719, 796, 799

[56] References Cited

U.S. PATENT DOCUMENTS

| | | |
|---|---|---|
| 4,004,195 | 1/1977 | Harayda . |
| 4,157,583 | 6/1979 | Busmajian . |
| 4,867,235 | 9/1989 | Grapes . |
| 5,047,837 | 9/1991 | Kitano . |
| 5,671,125 | 9/1997 | Russell . |
| 5,877,937 | 3/1999 | Shibata . |
| 5,949,650 | 9/1999 | Bulante . |

FOREIGN PATENT DOCUMENTS

| | | |
|---|---|---|
| 0682366A2 | 11/1995 | European Pat. Off. . |
| 6291233 | 10/1994 | Japan . |

*Primary Examiner*—Gerald Tolin
*Attorney, Agent, or Firm*—Herbert L. Lerner; Laurence A. Greenberg; Werner H. Stemer

[57] ABSTRACT

A VSMP semiconductor component is mounted by inserting an auxiliary element into a slot in a receptacle. The auxiliary element projects laterally from a narrow side of the semiconductor component and, as the auxiliary element is inserted into the slot, the semiconductor component is properly positioning on the printed circuit board.

5 Claims, 3 Drawing Sheets

SEMICONDUCTOR COMPONENT ASSEMBLY

BACKGROUND OF THE INVENTION

1. Field of the Invention

The invention relates to a semiconductor component assembly with a VSMP semiconductor component that includes at least one semiconductor chip, electrically conductive leads, and a housing enclosing the semiconductor chip. The leads are routed out at an edge (narrow side) of the housing. At least one electrically conductive and/or thermally conductive auxiliary element is received in a receptacle for the purpose of positioning the semiconductor component.

A multiplicity of new housing designs have most recently been developed for the ever more powerful semiconductor components. One of those designs is the so-called VSMP (Vertical Surface Mount Package) design, which is disclosed, for example, in published Japanese patent application JP-6-291 233 A and in U.S. Pat. No. 5,671,125 to Russell et al. (EP 0 682 366 A2). Those housings were previously proposed in particular for new high-performance memory modules. In the design, the leads are routed out only on a narrow side of the housing, the housing being arranged such that it stands vertically on a printed circuit board. The connections or leads are thereby each routed away alternately to a side, in order to increase the spacing between two leads on a side. As a rule, however, the distance between the leads is so small in this form that problems arise during mounting on the printed circuit board in the course of positioning and/or in the course of soldering in that position. These problems are additionally intensified by the vertical assembly of the component.

In this context, U.S. Pat. No. 5,671,125 discribes a semiconductor component assembly in which the vertically standing housing has alignment pins on its narrow side facing the printed circuit board. The pins cooperate with receptacles on the printed circuit board side. The receptacles are formed by through holes in the printed circuit board. When the alignment pins are inserted into the respectively assigned throughhole, the leads are thus prepositioned with regard to the printed circuit board. The threading-in operation and the monitoring of correct cooperation between the alignment pins and the throughholes are relatively difficult.

SUMMARY OF THE INVENTION

It is accordingly an object of the invention to provide a semiconductor component assembly, which overcomes the above-mentioned disadvantages of the heretofore-known devices and methods of this general type and which allows the component to be arranged on the printed circuit board easily and with the lowest possible outlay.

With the foregoing and other objects in view there is provided, in accordance with the invention, a semiconductor component assembly, comprising:

a VSMP semiconductor component to be mounted in a given mounting orientation, the semiconductor component including a housing having a first narrow side and a second narrow side, at least one semiconductor chip enclosed in the housing, and electrically conductive leads connected to the semiconductor chip and routed out of the housing at the first narrow side;

an electrically and/or thermally conductive auxiliary element formed at the second narrow side of the housing and extending substantially perpendicularly to the mounting orientation of the semiconductor component; and a receptacle for positioning the semiconductor component, the receptacle having a slot formed therein open toward the second narrow side of the semiconductor component for receiving the auxiliary element.

The electrically and/or thermally conductive auxiliary element routed out of the housing at one or two narrow sides of the housing becomes a positioning aid during mounting on the printed circuit board. An auxiliary element of this type, when it has been received in a receptacle in a semiconductor component assembly, has shielding properties if it is rendered electrically conductive and/or it has thermally conductive properties if it is rendered thermally conductive.

In accordance with an added feature of the invention, the receptacle includes an electrically conductive contact for electrically contacting the auxiliary element of the semiconductor component when it is inserted in the slot.

In accordance with an additional feature of the invention, the electrically conductive contact is connected to ground potential.

An additional positioning aid is produced in this case by a second auxiliary element. If such an auxiliary element is constructed within the housing in such a way that it largely surrounds the semiconductor chip, the auxiliary element can be used to dissipate heat. When the auxiliary element is constructed such that it is electrically conductive, then the assembly of this type serves for electromagnetic shielding. If two auxiliary elements are provided here, then the respective portion which surrounds the semiconductor chip can be divided. If, furthermore, one of the auxiliary elements is connected to an electrically conductive area on which the contact pads are arranged, or which is located opposite the area on which the contact pads are arranged, then this affords a shielding effect even in the direction perpendicular to these areas given an electrically conductive design of the auxiliary elements. However, this function can be implemented effectively only when the receptacle for the auxiliary element is likewise of electrically conductive design in a semiconductor component assembly.

In accordance with a concomitant feature of the invention, the receptacle has a heat sink. It has been shown to be especially advantageous if the receptacle is constructed with the additional heat sink for the purpose of better heat dissipation.

Other features which are considered as characteristic for the invention are set forth in the appended claims.

Although the invention is illustrated and described herein as embodied in a semiconductor component assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
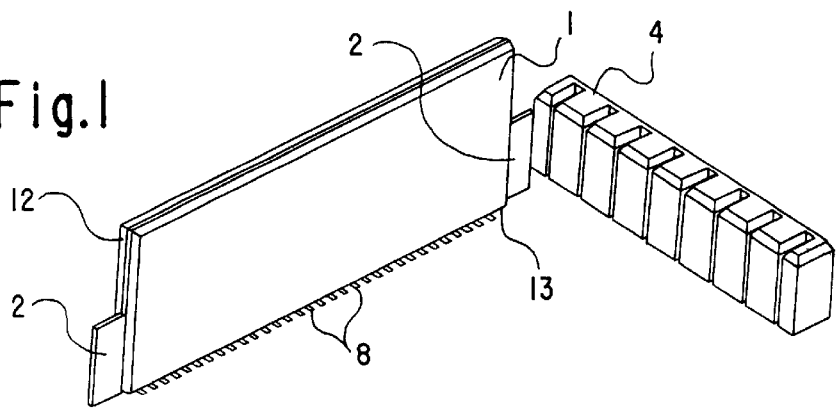
FIG. 1 is a perspective view of a VSMP semiconductor component together with a receptacle.

Referring now to the figures of the drawing in detail and first, particularly, to FIG. 1 thereof, there is seen a semiconductor component 1 according to the invention. The component is constructed in VSMP design. Connecting elements or leads 8, which serve to make electrical contact between a semiconductor chip disposed in the housing and conductor tracks on a printed circuit board, are illustrated on a downwardly directed narrow side (edge) of the component housing or housing 1. In the exemplary embodiment, auxiliary elements 2 in the form of laminae are routed out of the housing 1 at narrow sides 12, which are at right-angles to the edge 13 from which the leads 8 project. In this case, however, it is not absolutely necessary for the narrow sides from which the auxiliary elements 2 are routed out to be perpendicular to the first narrow side 13. These narrow sides could also equally well be arranged at any arbitrary angle to the first narrow side. Likewise, it is possible for the auxiliary element 2 to be routed out on the side opposite the first narrow side 13. Two auxiliary elements are provided in the exemplary embodiment illustrated in FIG. 1, which auxiliary elements are routed out of the housing 1 at opposite narrow sides. A receptacle 4 is illustrated beside the housing 1. The receptacle 4 is formed with slots 5 in order to receive an auxiliary element 2 of this type.

Figure 2:
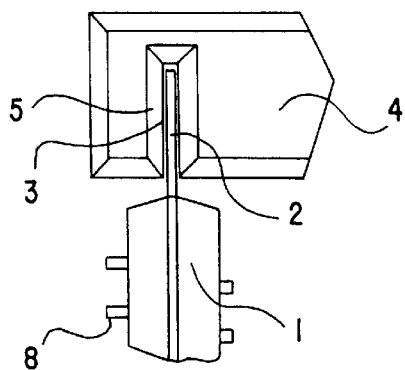
FIG. 2 is a partial plan view of a semiconductor component which is inserted into the receptacle.

The slightly enlarged plan view of FIG. 2 illustrates the semiconductor component inserted in the receptacle 4. In this case, the slot 5 of the receptacle 4 has contacts 3, which press against the auxiliary element 2.

Furthermore, the assembly of the leads 8 which are alternately routed away laterally from the housing 1 is illustrated in FIG. 2.

Figure 3:
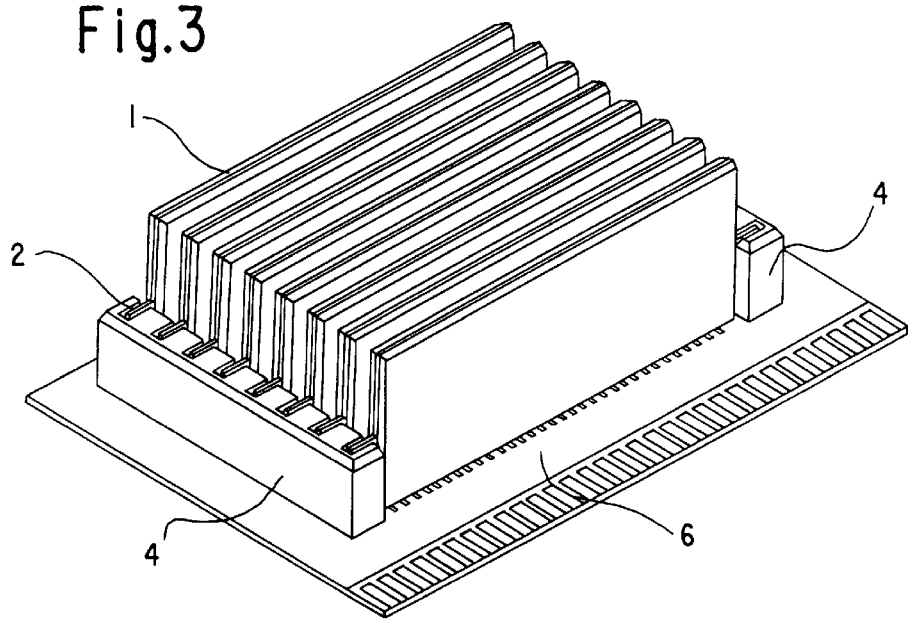
FIG. 3 is a perspective view of a semiconductor component assembly according to the invention with a plurality of semiconductor components on a printed circuit board.

FIG. 3 illustrates an assembly with several semiconductor components in VSMP design. It is thereby not important how many components are placed next to one another. As can be seen in FIG. 3, the two auxiliary elements 2 as are illustrated in FIG. 1 are inserted in a respective receptacle 4, the latter being arranged oppositely on a printed circuit board 6. It is further evident from the illustration of FIG. 3 that the semiconductor component can in this way be positioned very accurately with its leads 8 on the printed circuit board 6, with the result that the leads 8 can then easily be soldered.

Figure 4:
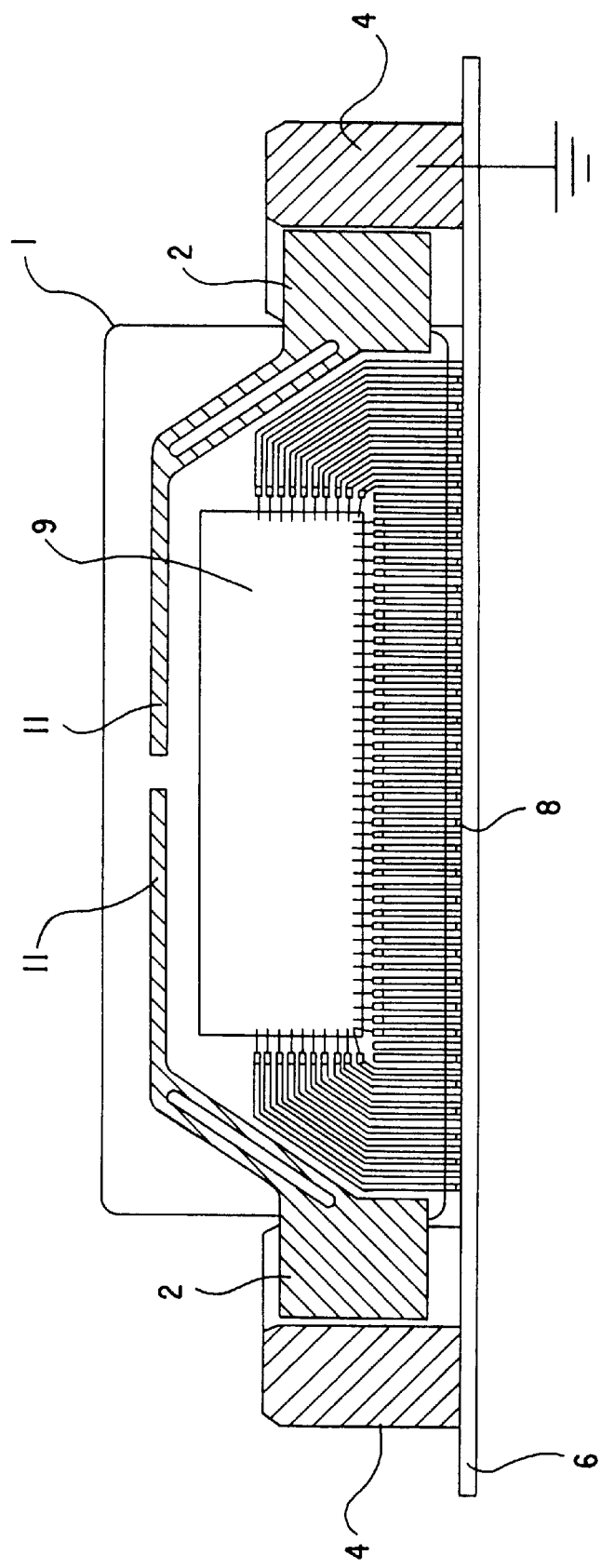
FIG. 4 is a sectional view of a novel semiconductor component in a semiconductor component assembly according to the invention.
Figure 5:
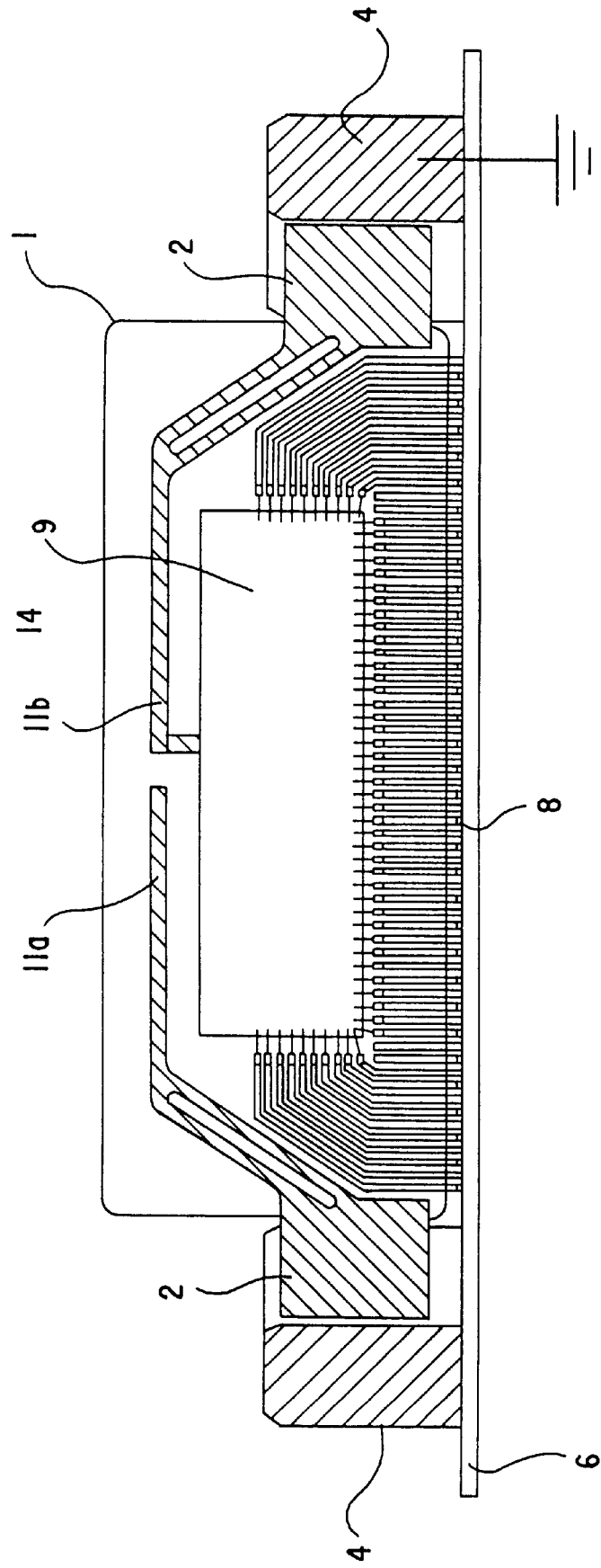
FIG. 5 is a sectional view of a further exemplary embodiment of a semiconductor component in a assembly according to the invention.

FIG. 4 and FIG. 5 each illustrates a section through a semiconductor component of this type. The edge of the housing 1 is thereby diagrammatically illustrated. The auxiliary elements 2 are likewise illustrated in the inserted assembly in the receptacle 4. The auxiliary elements 2 are brought as close as possible to the semiconductor chip 9 inside the housing 1, collisions with the leads 8 which are routed to the lower narrow side of the housing 1 being avoided. In accordance with FIG. 4, at least one of the receptacles 4 is constructed such that it is electrically conductive, and is connected to ground potential. In the event that both receptacles 4 are constructed such that they are electrically conductive and are connected to ground, the inner section 11 of the auxiliary elements 2 is designed to be electrically interrupted in order to avoid ground loops. The assembly illustrated affords a shielding effect for the semiconductor chip 9, which is necessary particularly in the case of new component generations which operate at clock frequencies of a few 100 MHz and with a transmission bandwidth in the GHz range.

With reference to FIG. 5, one of the inner sections 11a and 11b of the auxiliary elements 2 is electrically conductively connected to a conductive area on the opposite side of the semiconductor chip 9. This may be, for example, a die pad connected to the semiconductor chip 9. A shielding effect in the plane of the drawing is likewise produced in this way.

Independently of the electrically conductive embodiment of the auxiliary elements 2, the latter can likewise be constructed such that they are thermally conductive. As soon as the auxiliary elements have, as it were, the effect of "cooling fins" it is advantageous if the receptacle 4 as a whole is constructed as a heat sink in order to dissipate the heat generated by the semiconductor component. In particular, cooling ribs or the like are suitable for this purpose. The cooling ribs are not illustrated for purposes of clarity.

The auxiliary elements advantageously serve both for heat dissipation and for shielding of the semiconductor chip.

We claim:

1. A semiconductor component assembly, comprising:

at least one vertical surface mount package (VSMP) semiconductor component to be mounted in a given mounting orientation, said at least one semiconductor component including a housing having a first narrow side and a second narrow side, at least one semiconductor chip enclosed in said housing, and electrically conductive leads connected to said semiconductor chip and routed out of said housing at said first narrow side;

an auxiliary element at said second narrow side of said housing and extending substantially perpendicularly to the mounting orientation of said at least one semiconductor component; and a receptacle for positioning said at least one semiconductor component, said receptacle having at least one slot formed therein open toward said second narrow side of said at least one semiconductor component, said receptacle having inner sides defining said slot, said inner sides receiving and directly contacting said auxiliary element of said at least one semiconductor component.

2. The assembly according to claim 1, wherein said auxiliary element is an electrically and thermally conductive element.

3. The assembly according to claim 1, wherein said receptacle includes an electrically conductive contact electrically contacting said auxiliary element of said at least one semiconductor component.

4. The assembly according to claim 3, wherein said electrically conductive contact is connected to ground potential.

5. The assembly according to claim 1, wherein said receptacle has a heat sink.

* * * * *